Nov. 24, 1970 E. S. MURASKI 3,543,117

ELECTROMECHANICAL OSCILLATOR

Filed Jan. 9, 1969

INVENTOR
EDWARD S. MURASKI

BY
Morgan, Finnegan, Durham & Pine
ATTORNEYS

United States Patent Office 3,543,117

Patented Nov. 24, 1970

3,543,117

ELECTROMECHANICAL OSCILLATOR

Edward S. Muraski, Cos Cob, Conn., assignor to General Time Corporation, Stamford, Conn., a corporation of Delaware Filed Jan. 9, 1969, Ser. No. 790,076

Int. Cl. H02p 5/40

U.S. Cl. 318—329 15 Claims

ABSTRACT OF THE DISCLOSURE

An electromechanical oscillator which produces an asymmetrical output wave form and which operates at a submultiple of the tuning fork frequency.

BACKGROUND OF THE INVENTION

This invention relates to mechanically stabilized low frequency oscillator circuits and, while not limited thereto, relates particularly to such circuits suitable for use in battery powered clocks and timers.

Tuning forks are used as a common means for frequency stabilizing a low frequency oscillator circuit. The mechanical resonant frequency of a tuning fork depends principally upon its dimensions and, hence, can be extremely stable. The dimensions often become a problem, however, since very low frequency tuning forks e.g. 60 hertz, are inordinately large and bulky whereas high frequency tuning forks become extremely small and difficult to work with. Another problem with low frequency tuning forks is that they tend to be attitude sensitive, that is, changes in the physical orientation of the tuning fork can cause the resonant frequency to vary. For timer and clock applications, tuning forks operating at 300 hertz provide a good compromise as to size and relative insensitivity to attitude variations.

In clocks and timers where, for example, the oscillator is used to drive a synchronous motor, frequencies below 300 hertz are preferable since the higher frequencies require either frequency divider circuits or additional gear reduction. The additional components add to the cost and reduce reliability. These additional components also cause increased consumption of electrical power which can become a serious problem in battery powered applications.

BRIEF SUMMARY OF THE INVENTION

The oscillator circuit according to the invention produces an output signal which is a sub-multiple of the tuning fork resonant frequency and, for example, can provide a 60 hertz output signal using a 300 hertz tuning fork for stabilization. The oscillator circuit operates in a non-symmetrical, on-off fashion to produce a relatively short output pulse followed by a longer pause. Where the ratio of the tuning fork frequency to the output frequency is, for example, 5:1, the ratio of the output pulse width to the length of the pause between pulses is preferably 10:1 or greater so that the output pulse can be used to drive the tuning fork during the appropriate half cycle.

BRIEF DESCRIPTION OF THE DRAWING

An illustrative embodiment is described in the following detailed specification which includes the drawings and wherein.

DETAILED DESCRIPTION

Figure 1:
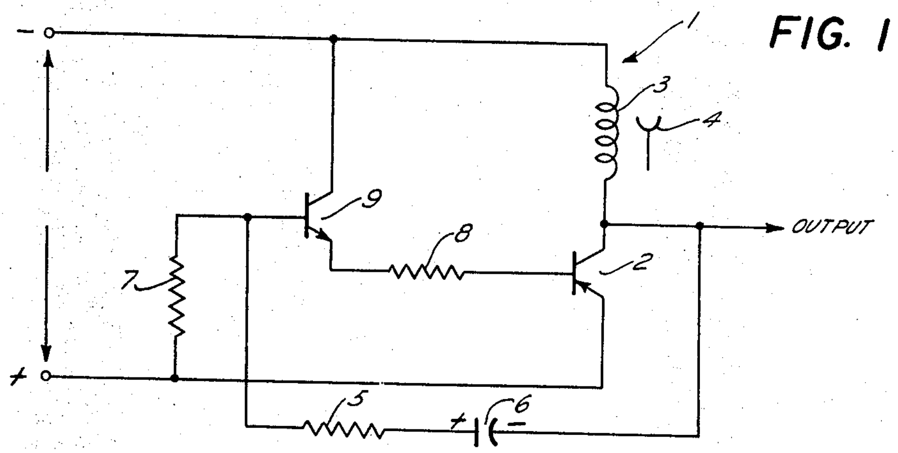
FIG. 1 is a schematic diagram illustrating an embodiment of the invention.

The operation of the invention will be described with respect to FIG. 1 wherein the circuit is a tuning fork oscillator 1 in which the voltage variations, in the form of pulses, appearing across the tuning fork drive coil 3, excite the tuning fork 4, causing it to vibrate. These vibrations in turn induce an EMF (electromotive force) in drive coil 3 which causes the oscillator circuit 1 to lock onto a sub multiple of the tuning fork frequency.

The time constant of resistor 5 and capacitor 6 determines the on time of oscillator 1. The time constant of resistor 7, resistor 5 and capacitor 6 affects the off time. Proper selection of these components determines not only the approximate output frequency for the oscillator, but also determines the ratio of on time to off time. The on time should be adjusted so that it corresponds to the half cycle period of the tuning fork. The EMF induced in drive coil 3 is utilized to control initiation of the output pulse to obtain exact synchronization. In this fashion the oscillator drives the tuning fork while maintaining exact synchronism at a submultiple of the tuning fork frequency.

FIG. 1 is one embodiment of the invention. Transistor 9 is an NPN type and transistor 2 is a PNP type. The circuit disclosed in FIG. 1 would work equally well, producing an output wave form of opposite polarity, if the polarity of the applied voltage were reversed and transistor 9 was a PNP type and transistor 2 an NPN type.

The emitter of transistor 2 is connected to the positive side of supply voltage V. The collector of transistor 2 is connected through drive coil 3 to the negative side of supply voltage V. The collector of transistor 9 is connected directly to the negative side of supply voltage V. The emitter of transistor 9 is connected through resistor 8 to the base of transistor 2. The base of transistor 9 is connected through resistor 7 to the positive side of supply voltage V. Resistor 5 and capacitor 6 form a series RC circuit regeneratively coupling the collector of transistor 2 to the base of transistor 9. The output signal of this oscillator circuit is taken from the collector of transistor 2.

Figure 2:
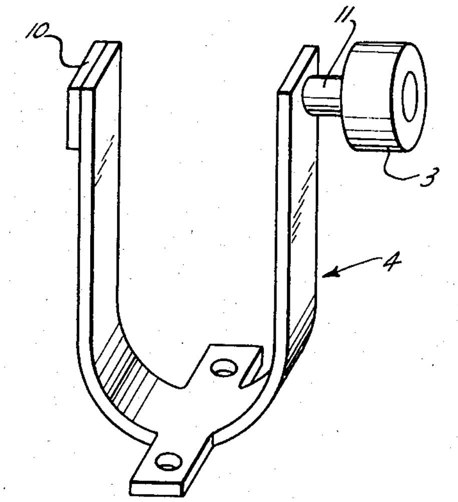
FIG. 2 is a perspective illustration of the tuning fork and associated drive and pickup coil.

FIG. 2 is an illustration of one way to couple the tuning fork 4 to the oscillator circuit. A balance weight 10 is affixed to one of the tines of tuning fork 4, the other tine having a permanent magnet 11 attached to it and located on an axis passing through the center of coil 3. As tuning fork 4 vibrates, permanent magnet 4 moves relative to drive coil 3, thereby inducing an alternating current in the drive coil.

Tuning fork 4 illustrated in FIG. 2 is a dynamic tuning fork, i.e., one in which the permanent magnet 4 is attached to one of the tines and moves with respect to the pickup and drive coil 3. Oscillator circuit 1 will also function with a tuning fork which is of a non-dynamic type, i.e., one where the permanent magnet is stationary and the tines move with respect to the permanent magnet and vary the reluctance of the magnetic path.

The operation of the oscillator circuit is best explained by assuming that a voltage has just been impressed across oscillator 1. Current flows through resistor 7 and into the base of transistor 9. Transistor 9 is operating in an "inverse mode." An NPN transistor is normally operated with the collector more positive than the emitter, whereas when operating in an in inverse mode the collector of an NPN transistor is more negative than the emitter. The purpose of operating transistor 9 in an inverse mode is to reduce its gain to less than unity, since if the gain of oscillator 1 is excessive it may "hang up" and remain in a saturated state.

The flow of current through resistor 7 and into the base of transistor 9 causes the collector-to-emitter resistance of transistor 9 to decrease. The decrease in collector-to-emitter resistance of transistor 9 results in impressing a negative voltage on the base of transistor 2 through the circuit path of resistor 8 and the collector-to-emitter resistance of transistor 9. The negative voltage on the base of transistor 2 causes the collector-to-emitter resistance of transistor 2 to decrease, thereby causing current flow through drive coil 3 and the collector-emitter circuit of transistor 2. The current flow through drive coil 3 produces a voltage drop across drive coil 3, thereby causing the voltage at the collector of transistor 2 to become less negative than when no current flowed through coil 3. The positive-going (less negative) voltage appearing at the collector of transistor 2 is applied to the base of transistor 9 through the feedback path comprised of resistor 5 and capacitor 6. A regenerative condition is established causing transistors 9 and 2 to saturate. While transistor 2 is in saturation the tuning fork drive coil 3 is energized by a potential equal to the supply voltage minus the collector-emitter saturation voltage of transistor 2.

The time constant resistor 5 and capacitor 6 determines the on time of oscillator 1. Once transistors 2 and 9 have saturated there will be an exponential decay of the base current of transistor 9, the rate of decay determined by the above time constant, until a point is reached when transistor 9 comes out of saturation, which in turn reduces the base current drive of transistor 2 causing it too to come out of saturation. A regenerative condition is established causing both transistors to turn off rapidly.

With transistor 2 and transistor 9 turned off, there is a charge on capacitor 6 of such polarity that the base of transistor 9 is made negative. This charge is dissipated at a rate determined by the time constant formed by resistor 7, resistor 5 and capacitor 6. The time constant formed by these three circuit elements is related to the EMF generated across drive coil 3 when permanent magnet 11 enters the core of drive coil 3.

When permanent magnet 11 enters the core of drive coil 3 an EMF is generated which manifests itself as a positive-going voltage appearing at the collector of transistor 2. The positive-going voltage at the collector of transistor 2 is coupled to the base of transistor 9 by resistor 5 and capacitor 6. The positive-going voltage is present at the collector of transistor 2 each time the permanent magnet 11 enters the core of drive coil 3, or once for each cycle of vibration of tuning fork 4. Tuning fork 4 vibrates at its fundamental frequency and it is desired to drive tuning fork 4 at a sub-multiple of that fundamental frequency.

Assume it is desired to drive tuning fork 4 at one fifth of its fundamental frequency. Then, if the initial entry of permanent magnet 11 into the core of drive coil 3, which entry occurred when drive coil 3 was energized, is deemed the first entry, then the sixth time permanent magnet 11 enters the core of drive coil 3 said coil should also be energized.

To ensure that the tuning fork 4 determines the output frequency of the oscillator the following conditions must be met. The exponential dissipation of the charged stored in capacitor 6, which is at a rate determined by resistor 7, resistor 5 and capacitor 6, must be sufficiently slow so that transistor 9 and transistor 2 are off at the time permanent magnet 11 enters the core of drive coil 3 for the sixth time. The exponential dissipation of the charge stored in capacitor 6 must be sufficiently rapid so that the entry of permanent magnet 11 into the core of drive coil 3 for the sixth time will be sufficient to initiate the regenerative turn on of transistor 2 and transistor 9.

The regenerative turn on of transistor 2 and transistor 9 occurs in the following manner. The entry of permanent magnet 11 into the core of drive coil 3 induces an EMF across drive coil 3. This EMF appears in the form of a positive going voltage at the collector of transistor 2 and is coupled via resistor 5 and capacitor 6 to the base of transistor 9. The charge stored in capacitor 6 must have been sufficiently dissipated so that the residual negative voltage on the base of transistor 9 is exceeded by the positive voltage which has been coupled from the collector of transistor 2 to the base of transistor 9 through resistor 5 and capacitor 6. If the residual negative voltage on the base of transistor 9 is exceeded, then transistor 9 will begin to conduct and a regenerative turn on of transistor 2 and transistor 9 will have been effected.

It is to be noted that of necessity the output wave form appearing at the collector of transistor 2 is non symmetrical. This represents a significant saving in power in the oscillator circuit. This circuit is able to produce an output frequency which is stable, so far as attitude variations are concerned, but without driving tuning fork 4 during every cycle of said tuning fork. This circuit combines the advantages of a high fundamental frequency of oscillation of tuning fork 4 with the low power consumption requirements of a battery powered clock mechanism.

Figure 3A:
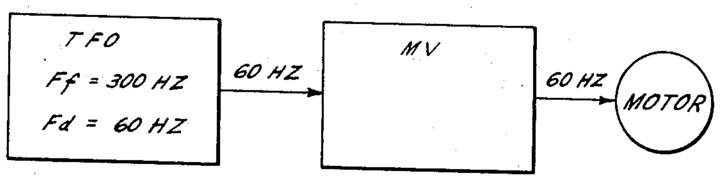
FIGS. 3*a* and 3*b* are block diagrams of two possible configurations for driving a synchronous motor of a battery powered clock.

FIG. 3*a* illustrates one configuration for driving or synchronizing the motor of a battery powered clock. The configuration comprises a tuning fork oscillator (TFO) wherein the tuning fork has a fundamental frequency ($F_f$) of 300 hertz and the tuning fork is pulsed at a drive frequency ($F_d$) of 60 hertz. The frequency of the output of the TFO is 60 hertz. This is fed to a monostable multivibrator (MV) which also produces an output signal of frequency 60 hertz. The MV output signal is used to drive the clock motor which can be an ordinary 60 hertz synchronous motor.

Figure 3B:
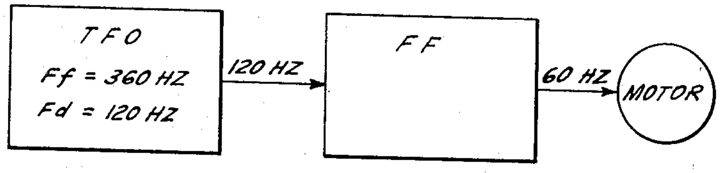

FIG. 3*b* illustrates a second configuration for driving or synchronizing the motor of a battery powered clock. This configuration comprises a tuning fork oscillator (TFO) wherein the fundamental frequency ($F_f$) of the tuning fork is 360 hertz and the tuning fork is pulsed at a drive frequency ($F_d$) of 120 hertz. The frequency of the TFO output signal is 120 hertz. The TFO output signal is fed to a bistable multivibrator or flip-flop (FF). The FF circuit performs a frequency division of two to produce an output signal of frequency 60 hertz. The FF output signal is used to drive the clock motor.

It is to be understood that although only one embodiment of the invention is described in detail there are other circuits and drive coil configurations which can be used which also employ the invention disclosed herein. The invention is more particularly defined in the appended claims.

What is claimed is:

1. An electromechanical oscillator, comprising:
a resonant mechanical device having a resonant fundamental frequency;
an electrical oscillator circuit
  tuned to operate at a fundamental frequency which is sub-harmonic of said resonant fundamental frequency of said mechanical device, and
  operative to produce an output signal which is non-symmetrical with the duration of the on time being less than the half cycle duration of said resonant fundamental of said mechanical device; and
means interconnected between said resonant mechanical device and said oscillator
  so that said resonant mechanical device is driven by said output signal during said on time, and
  so that said oscillator is synchronized by said resonant mechanical device.

2. An electromechanical oscillator according to claim 1 wherein said resonant mechanical device is a tuning fork.

3. An electromechanical oscillator according to claim 1 wherein said electrical oscillator circuit is a semiconductor oscillator circuit.

4. An electromechanical oscillator according to claim 1 wherein said means interconnected between said resonant mechanical device and said oscillator comprises a single coil for driving mechanical resonant device and for developing a feedback signal for synchronizing said electrical oscillator.

5. An electromechanical oscillator according to claim 4 wherein said mechanical resonant device is a tuning fork and wherein said interconnected means further comprises a permanent magnet attached to said tuning fork and magnetically coupled to said coil.

6. An electromechanical oscillator according to claim 1 wherein said fundamental frequency of said electrical oscillator is an odd sub multiple of said resonant fundamental frequency of said mechanical device.

7. An electromechanical oscillator comprising:
- a resonant mechanical device having a resonant fundamental frequency;
- a transistor oscillator for producing a non symmetrical output signal, said oscillator including a regenerative feedback path
  - having a first time constant for controlling the on time of said output signal so that said on time is less than the half-cycle duration of said resonant fundamental frequency of mechanical device, and
  - having a second time constant for controlling the off time of said output signal so that the frequency of said output signal is a sub multiple of said resonant fundamental frequency of said mechanical device; and
- means interconnected between said resonant mechanical device and said oscillator
  - so that said resonant mechanical device is driven by said output signal during said on time, and
  - so that said oscillator is synchronized by said resonant mechanical device.

8. An electromechanical oscillator according to claim 7 wherein said resonant mechanical device is a tuning fork.

9. An electromechanical oscillator according to claim 7 wherein said transistor oscillator comprises a pair of complementary transistors.

10. An electromechanical oscillator according to claim 7 wherein said first and second time constants are RC time constants.

11. An electromechanical oscillator according to claim 7 wherein the frequency of said non symmetrical output signal is one third of said resonant fundamental frequency of said resonant mechanical device.

12. An electromechanical oscillator, comprising:
- a resonant mechanical device having a resonant fundamental frequency;
- an electrical oscillator circuit
  - tuned to operate at a fundamental frequency which is a sub-harmonic of said resonant fundamental frequency of said mechanical device, and
  - operative to produce an output signal which is non symmetrical, with the duration of the on time being less than the half cycle duration of said resonant fundamental of said mechanical device;
- means interconnected between said resonant mechanical device and said oscillator
  - so that resonant mechanical device is driven by said output signal during said on time, and
  - so that said oscillator is synchronized by said resonant mechanical device;
- an electrical motor; and
- circuit means interconnected between said motor and said electrical oscillator, said circuit means being responsive to said output signal and operative to provide a drive signal for said motor.

13. An electromechanical oscillator according to claim 12 wherein said circuit means is a monostable multivibrator.

14. An electromechanical oscillator according to claim 12 wherein said circuit means is a bistable multivibrator.

15. An electromechanical oscillator according to claim 12 wherein said electrical motor is a synchronous motor.

References Cited

UNITED STATES PATENTS

| | | | |
|---|---|---|---|
| 3,116,466 | 12/1963 | Grib | 58—23 |
| 3,250,066 | 5/1966 | Engelhardt | 318—329 |

ORIS L. RADER, Primary Examiner

A. G. COLLINS, Assistant Examiner

U.S. Cl. X.R.

58—23; 318—128, 451; 331—156